(12) United States Patent
Jo et al.

(10) Patent No.: US 7,804,370 B2
(45) Date of Patent: Sep. 28, 2010

(54) FREQUENCY GENERATOR

(75) Inventors: Byeong Hak Jo, Gyunggi-Do (KR); Yoo Sam Na, Seoul (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 21 days.

(21) Appl. No.: 12/129,219

(22) Filed: May 29, 2008

(65) Prior Publication Data

US 2009/0153256 A1 Jun. 18, 2009

(30) Foreign Application Priority Data

Dec. 13, 2007 (KR) ........................ 10-2007-0129864

(51) Int. Cl.
*H03B 21/01* (2006.01)
*H03L 7/181* (2006.01)
*H03L 7/185* (2006.01)

(52) U.S. Cl. .............................. 331/42; 331/16; 331/40

(58) Field of Classification Search ................... 331/16, 331/37, 40, 42
See application file for complete search history.

(56) References Cited

U.S. PATENT DOCUMENTS 6,526,265 B1 * 2/2003 Damgaard et al. .......... 455/118

2007/0026816 A1 2/2007 Heidari et al.

FOREIGN PATENT DOCUMENTS

JP 2002-246845 8/2002

* cited by examiner

*Primary Examiner*—Robert Pascal
*Assistant Examiner*—James E Goodley
(74) *Attorney, Agent, or Firm*—Lowe Hauptman Ham & Berner LLP

(57) ABSTRACT

There is provided a feedback circuit including: an oscillator generating an oscillation frequency signal; a mixer unit having an input terminal, a feedback terminal, and an output terminal and outputting a frequency signal through the output terminal, the frequency signal obtained by adding or subtracting frequency of a feedback signal, input through the feedback terminal, to or from frequency of the oscillation frequency signal input through the input terminal from the oscillator; a first frequency divider dividing the frequency signal output from the mixer unit at a division ratio of N (N is a multiple of 2) to generate an output signal; and a feedback circuit adjusting the output signal of the first frequency divider for the first frequency divider to output a frequency signal in a desired band and feeding back the adjusted signal to the feedback terminal of the mixer unit.

10 Claims, 6 Drawing Sheets

US 7,804,370 B2

FREQUENCY GENERATOR

CROSS-REFERENCE TO RELATED APPLICATIONS

This application claims the priority of Korean Patent Application No. 2007-0129864 filed on Dec. 13, 2007, in the Korean Intellectual Property Office, the disclosure of which is incorporated herein by reference.

BACKGROUND OF THE INVENTION

1. Field of the Invention

The present invention relates to a frequency generator, and more particularly, to a frequency generator that uses one oscillator and includes frequency dividers and a feedback circuit to output a frequency signal in a plurality of domains.

2. Description of the Related Art

Wireless transceivers basically require local oscillator (LO) signals. Broadband characteristics are one of the most important characteristics of LO that have been required these days.

In order to satisfy the broadband characteristics of the LO, capacitor banks may be generally used. When a required band is less than ±15% (30% in total) on the basis of a center frequency, one LC tank and an additional capacitor may be used according to an on and off operation without phase noise. This is a limitation occurring due to a trade-off between the phase noise and tuning range.

However, when the tuning range exceeds 30%, it is difficult to satisfy the broadband characteristics and low-phase noise characteristics at the same time.

Among methods of obtaining broadband characteristics, one is to use a plurality of LC tanks. According to this method, it is possible to obtain a desired tuning range without causing deterioration in phase noise characteristics. For example, when three voltage control oscillators each having a tuning range of 30% are used, a tuning range of 90% can be theoretically obtained. Even when there is a margin in consideration of a process variation, a tuning range of approximately 70% or more can be obtained.

However, since an inductor generally occupies an area of the VCO at a ratio of 50% or more, when the plurality of LC tanks are used, a chip size increases due to the size of the inductor. Therefore, it is difficult to reduce the size of the VCO, and manufacturing costs increase.

SUMMARY OF THE INVENTION

An aspect of the present invention provides a frequency generator that is reduced in size and has a wide tuning range by using frequency dividers dividing oscillation frequency generated by one oscillator at predetermined division ratios and a feedback circuit feeding back an output frequency signal.

According to another aspect of the present invention, there is provided a feedback circuit including: an oscillator generating an oscillation frequency signal; a mixer unit having an input terminal, a feedback terminal, and an output terminal and outputting a frequency signal through the output terminal, the frequency signal obtained by adding or subtracting frequency of a feedback signal, input through the feedback terminal, to or from frequency of the oscillation frequency signal input through the input terminal from the oscillator; a first frequency divider dividing the frequency signal output from the mixer unit at a division ratio of N (N is a multiple of 2) to generate an output signal; and a feedback circuit adjusting the output signal of the first frequency divider for the first frequency divider to output a frequency signal in a desired band and feeding back the adjusted signal to the feedback terminal of the mixer unit.

The first frequency divider may have a division ratio of 2.

The feedback circuit may operate so that the output signal of the first frequency divider is output as a frequency signal divided into first to fourth domains.

The feedback circuit may include: a second frequency divider dividing the output signal of the first frequency divider at a division ratio of M (M is a multiple of b2) to generate an output signal; and a multiplexer receiving the signal of the first frequency divider and the signal of the second frequency divider and adjusting the signals fed back into the mixer unit.

The first domain may be a frequency domain in which the oscillation frequency is divided at a division ratio of N+1.

The second domain may be a frequency domain in which the oscillation frequency is divided at a division ratio of N+1/M.

The third domain may be a frequency domain in which the oscillation frequency is divided at a division ratio of 1/N.

The fourth domain may be a frequency domain in which the oscillation frequency is divided at a division ratio of N−1/M.

The second frequency divider may have a division ratio of 2.

According to another aspect of the present invention, there is provided a frequency generator including: an oscillator generating oscillation frequency; a mixer unit having an input terminal, a feedback terminal, and an output terminal, and outputting a frequency signal through the output terminal, the frequency signal obtained by adding or subtracting feedback signal frequency, input through the feedback terminal, to or from the oscillation frequency input through the input terminal from the oscillator; and a feedback circuit including a first frequency divider dividing the frequency signal output from the mixer unit at a division ratio of 2 to generate an output signal, a second frequency divider dividing the output signal of the first frequency divider at a division ratio of 2 to generate an output signal; and a multiplexer receiving the signal of the first frequency divider and the signal of the second frequency divider and adjusting the signal fed back into the mixer unit.

multiplexer may adjust the signals fed back into the mixer unit so that the output signal of the first frequency divider includes one frequency domain selected from: a first frequency domain obtained by dividing the oscillation frequency at a division ratio of 3; a second frequency domain obtained by dividing the oscillation frequency at a division ratio of 2.5; a third frequency domain obtained by dividing the oscillation frequency at a division ratio of 2; and a fourth frequency domain obtained by dividing the oscillation frequency at a division ratio or 1.5.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
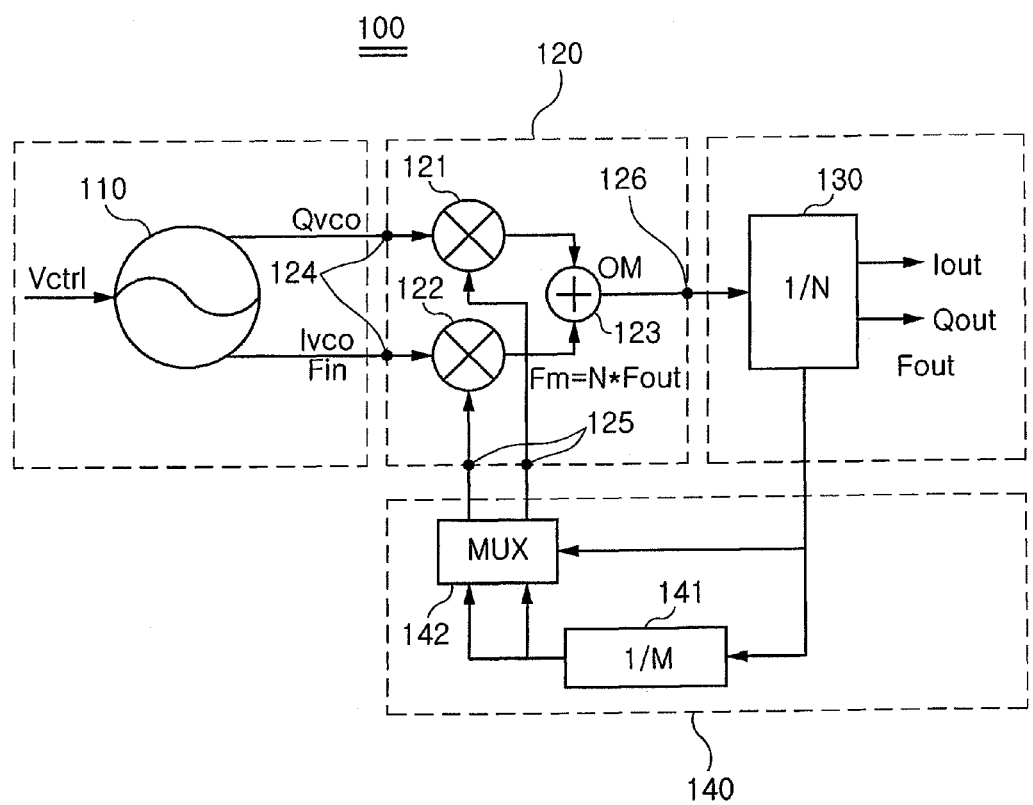
FIG. 1 is a configuration diagram illustrating a frequency generator according to an exemplary embodiment of the present invention.

FIG. 1 is a configuration view illustrating a frequency generator according to an exemplary embodiment of the invention.

Referring to FIG. 1, a frequency generator 100 according to an exemplary embodiment of the invention may include an oscillator 110, a mixer unit 120, a first frequency divider 130, and a feedback circuit 140.

The oscillator 110 may be configured to generate predetermined oscillation frequency fin. The oscillation frequency fin may be a quadrature signal.

The mixer unit 120 includes an input terminal 124, a feedback terminal 125, and an output terminal 126. A frequency signal obtained by subtracting feedback signal frequency, input through the feedback terminal 125, from the oscillation frequency, input through the input terminal 124 from the oscillator, may be output through the output terminal 126. The mixer unit 120 may be a single side band mixer.

The mixer unit 120 may include a first mixer 121, a second mixer 122, and a third mixer 123.

Quadrature signals Qvco and Ivco, output from the oscillator 110, may be input to the first mixer 121 and the second mixer 122, respectively. Further, quadrature signals fed back by the feedback circuit 140 may be input to the first mixer 121 and the second mixer 122. Each of the first mixer 121 and the second mixer 122 may multiply the quadrature signal input by the oscillator 110 by the quadrature signal input by the feedback circuit 140. The third mixer 123 may add the signal output from the first mixer 121 and the signal output from the second mixer 122 to output a differential signal.

For example, when quadrature signals cos ω2t and sin ω2t are input from the oscillator 110 to the first mixer 121 and the second mixer 122, respectively, and quadrature signals cos ω1t and sin ω1t are input from the feedback circuit 140 to the first mixer 121 and the second mixer 122, respectively, the first mixer 121 has an output of cos ω2t×cos ω1t, and the second mixer 122 has an output of sin ω2t×sin ω1t. Since the third mixer 123 adds the output of the first mixer and the output of the second mixer, the third mixer 123 may output a signal of cos (ω1−ω2)t. That is, a frequency of the signal output from the mixer unit 120 may be obtained by subtracting the frequency of the feedback circuit from the oscillation frequency of the oscillator.

For another example, when quadrature signals cos ω2t and sin ω2t are input from the oscillator 110 to the first mixer 121 and the second mixer 122, respectively, and quadrature signals sin ω1t and cos ω1t are input from the feedback circuit 140 to the first mixer 121 and the second mixer 122, respectively, the first mixer 121 has an output of cos ω2t×sin 1t, and the second mixer 122 has an output of sin ω2t×sin ω1t. Since the third mixer 123 adds the output of the first mixer and the output of the second mixer, the third mixer 123 may output a signal of cos (ω1+ω2)t.

The first frequency divider 130 divides the output signal of the mixer unit 120 at a predetermined division ratio of N to generate an output signal. Here, N may be a multiple of 2.

In this embodiment, the first frequency divider 130 may have a division ratio of 2. The first frequency divider 130 may divide the differential signal output from mixer unit 120 into quadrature signals and output the quadrature signals.

An output signal Fout obtained by dividing the differential signal by the first frequency divider 130 may be provided as a local oscillator signal.

The feedback circuit 140 may adjust the output signal of the first frequency divider 130 and feedback the adjusted signal to the feedback terminal 125 of the mixer unit 120 so that first frequency divider 130 can output a frequency signal in a desired band.

The feedback circuit 140 may include a second frequency divider 141 and a multiplexer 142. The second frequency divider 141 divides the output signal of the first frequency divider 130 at a division ratio of M to generate an output signal. The multiplexer 142 receives the output signal of the first frequency divider 130 and the output signal of the second frequency divider 141 and adjusts the signals fed back into the mixer unit 120. Here, M may be a multiple of 2.

In this embodiment, the multiplexer 142 may adjust the output signal Fout of the first frequency divider 130, such that the output signal Fout divided into first to fourth domains may be output.

The first domain may correspond to a signal obtained by dividing the output signal of the oscillator 110 at a division ratio of N+1. The second domain may correspond to a signal obtained by dividing the output signal of the oscillator 110 at a division ratio of N+1/M. The third domain may correspond to a signal obtained by dividing the output signal of the oscillator 110 at a division ratio of N. The fourth domain may correspond to a signal obtained by dividing the output signal of the oscillator 110 at a division ratio of N−1/M.

Figure 2:
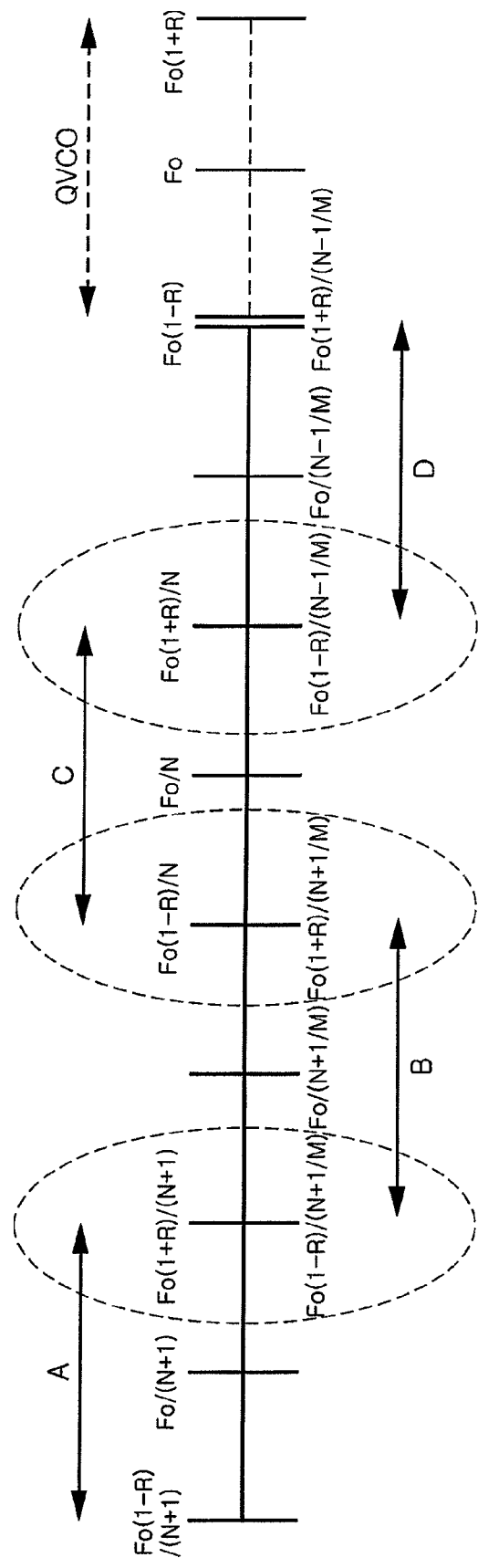
FIG. 2 is a view illustrating first to fourth frequency signal domains that are output from the frequency generator according to the embodiment of FIG. 1.

FIG. 2 is a view illustrating first to fourth frequency signal domains that are output by the frequency generator according to the embodiment of FIG. 1.

Referring to FIG. 2, the frequency generator according to this embodiment may include an oscillator QVCO that has a center frequency Fo and a tuning range of ±R. In this embodiment, the frequency signal generated by the oscillator may be divided into four domains.

The frequency generator may operate in the first to fourth domains. That is, the frequency generator may output frequency signals corresponding to domains A, B, C, and D. The four operating domains may be frequency signals obtained by dividing the output signal of the oscillator at division ratios of N+1, N+1/M, N, and N−1/M.

Here, the following Equation needs to be satisfied in order that the frequency generator has a continuous tuning range in the operating domains.

$$\frac{Fo(1+R)}{N+1} > \frac{Fo(1-R)}{N+1/M} \qquad \text{[Equation 1]}$$

$$\frac{Fo(1+R)}{N+1/M} > \frac{Fo(1-R)}{N} \qquad \text{[Equation 2]}$$

$$\frac{Fo(1+R)}{N} > \frac{Fo(1-R)}{N-1/M} \qquad \text{[Equation 3]}$$

In the above Equations 2 and 3, when the frequency generator has a tuning range R of 15% or less, the following Equation 4 needs to be satisfied.

$$NM \geq 3.84 \qquad \text{[Equation 4]}$$

In the above Equation 1, when the frequency generator has a tuning range R of 15% or less, the following Equations 5 and 6 need to be satisfied.

$$M \leq \frac{115}{85 - 30N}, (N < 4)$$ [Equation 5]

$$M \geq \frac{115}{85 - 30N}, (N \geq 4)$$ [Equation 6]

Since N and M are multiples of 2, when N is 2 in the Equation 5, M can be 2 or 4. When N is 4 or more in the Equation 6, M can be a multiple of 2.

According to an embodiment of the invention, when the oscillator QVCO has an operating frequency in the range of approximately 2800 to 3800 MHz, the frequency generator has a center frequency Fo of 3300 MHz and an operating frequency range of 1000 MHz. Therefore, the frequency generator may have a tuning range R of approximately 30.3%, that is, ±15.15%. At this time, the first frequency divider may have a division ratio of 2, and the second frequency divider may have a division ratio of 2.

The frequency generator according to this embodiment may output the signal of the oscillator as first to fourth domain frequency signals.

In this embodiment, the first domain A corresponds to an operating frequency in the range of approximately 933 to 1266 MHz. A center frequency Fo/3 may be approximately 1100 MHz, and a tuning range may be approximately 30.3%.

In this embodiment, the second domain B corresponds to an operating frequency in the range of approximately 1120 to 1520 MHz. A center frequency Fo/2.5 may be approximately 1350 MHz, and a tuning range may be approximately 30.3%.

In this embodiment, the third domain C corresponds to an operating frequency in the range of approximately 1400 to 1900 MHz. A center frequency Fo/2 may be approximately 1650 MHz, and a tuning range may be approximately 30.3%.

In this embodiment, the fourth domain D corresponds to an operating frequency in the range of approximately 1866 to 2533 MHz. A center frequency Fo/1.5 may be approximately 2200 MHz, and a tuning range may be approximately 30.3%.

Therefore, according to this embodiment, by using the oscillator QVCO having an operating frequency in the range of approximately 2800 to 3800 MHz, the frequency generator can have an operating frequency in the range of approximately 933 to 2533 MHz. The frequency generator may have the entire tuning range of approximately 92.3%.

Figure 3A:
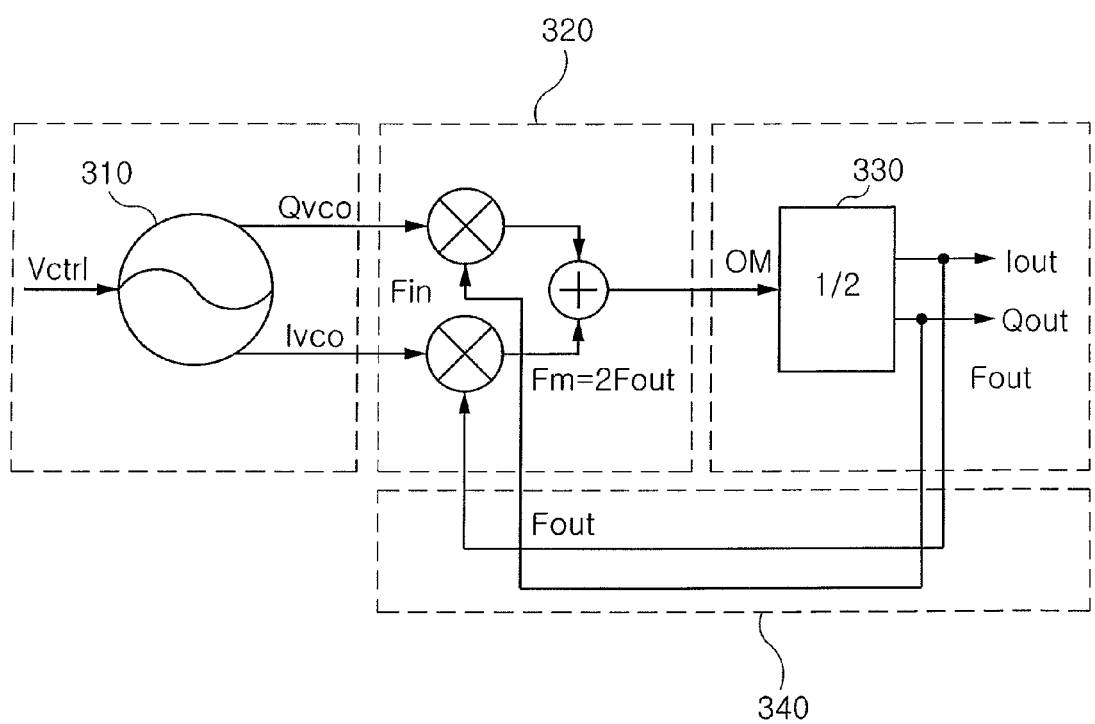
FIGS. 3A to 3D are views illustrating the operation of a feedback circuit such that the frequency generator according to the embodiment of FIG. 1 outputs output signals corresponding to modes A, B, C, and D, shown in FIG. 2.

FIG. 3A is a view illustrating the operation of the feedback circuit such that the frequency generator according to the embodiment, shown in FIG. 1, can output an output signal corresponding to the mode A of FIG. 2.

Referring to FIG. 3A, in the frequency generator according to this embodiment, a feedback circuit 340 may feedback to a mixer unit 320, the quadrature signals divided by the first frequency divider 330 at a division ratio of 1/2. That is, the multiplexer in the feedback circuit only selects an output signal of the first frequency divider and outputs the selected output signal to the mixer unit.

In the mixer unit 320, the following equation is obtained.

$F\text{in} - F\text{out} = 2F\text{out}$

Therefore, the following equation may be obtained.

$F\text{out} = F\text{in}/3$

That is, the mixer unit 320 operates as a down converter. The frequency signal output by the first frequency divider 330 may be a signal obtained by dividing the frequency signal output from an oscillator 310 at a division ratio of 1/3.

Figure 3B:
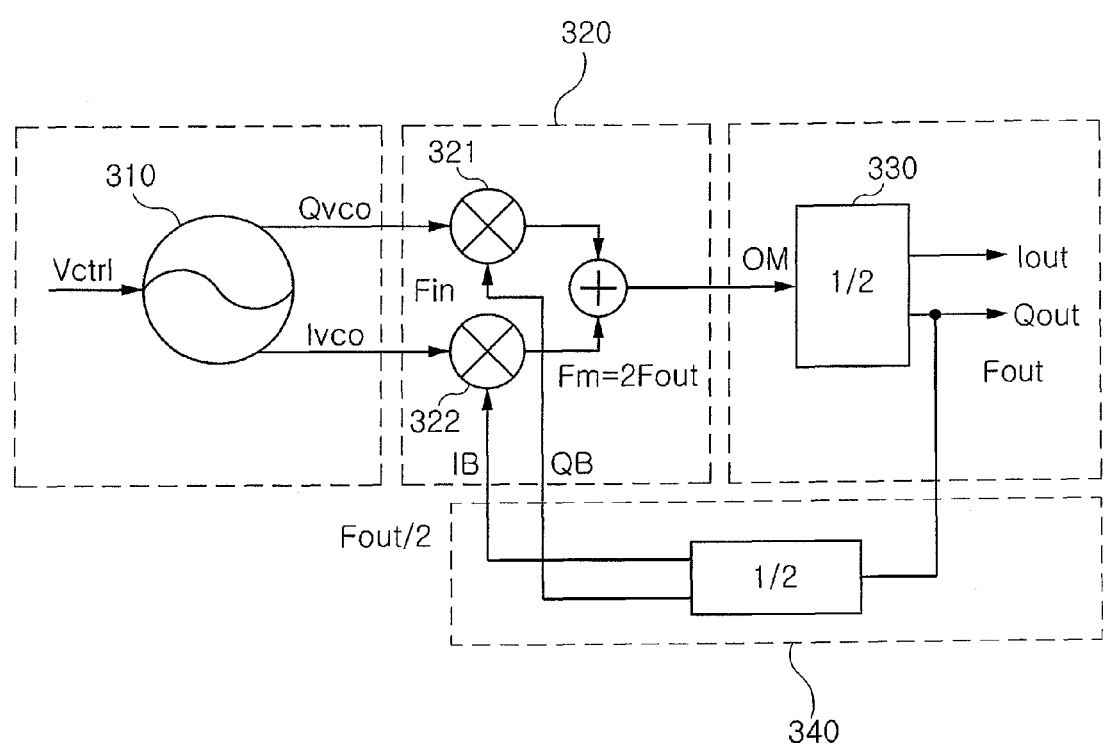

FIG. 3B is a view illustrating the operation of the feedback circuit 340 such that the frequency generator according to the embodiment, shown in FIG. 1, can output an output signal corresponding to the mode B of FIG. 2.

Referring to FIG. 3B, in the frequency generator according to the embodiment, the feedback circuit 340 may divide the signal, divided by the first frequency divider 330 at the division ratio of 1/2, at a division ratio of 1/2 and feedback the divided signal to the mixer unit 320. Here, in order that the mixer unit operates as a down converter, the multiplexer in the feedback circuit may send a Q signal to a first mixer 321 in the mixer unit and an I signal to the a second mixer 322 in the mixer unit.

Here, in the mixer unit 320, the following equation can expressed.

$F\text{in} - F\text{out}/2 = 2F\text{out}$

Therefore, the following equation can be obtained.

$F\text{out} = F\text{in}/2.5$

That is, the mixer unit operates as a down converter. The frequency signal output from the first frequency divider 330 may be a signal obtained by dividing the frequency signal output from the oscillator 310 at a division ratio of 1/2.5.

Figure 3C:
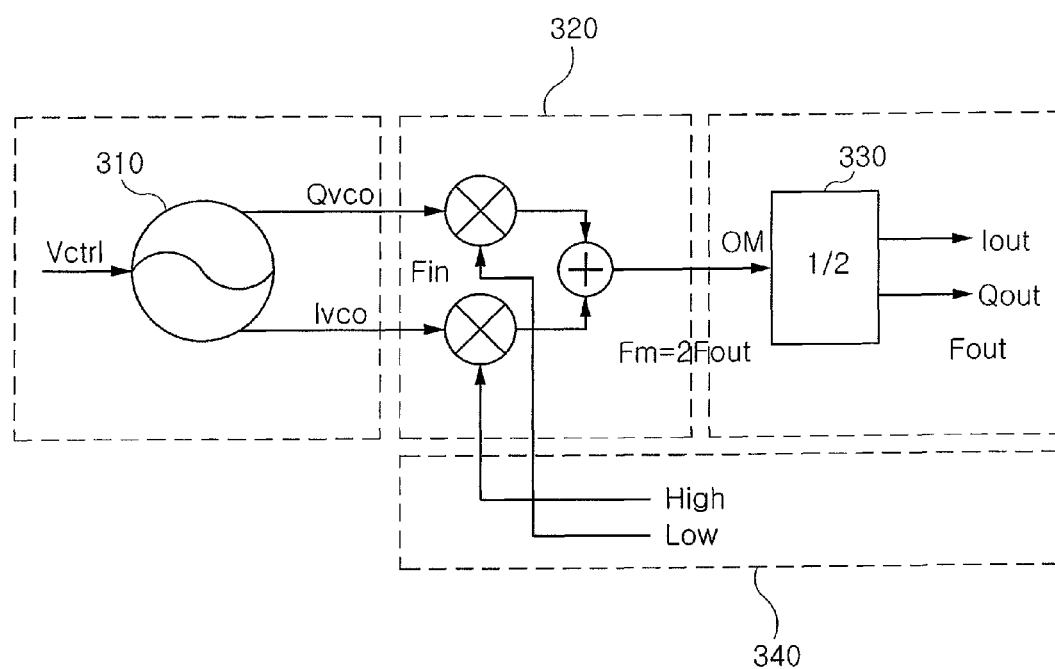

FIG. 3C is a view illustrating the operation of the feedback circuit 340 such that the frequency generator according to the embodiment, shown in FIG. 1, can output an output signal corresponding to the mode C of FIG. 2.

Referring to FIG. 3C, in the frequency generator according to this embodiment, the feedback circuit 340 may make the mixer unit 320 simply operate as a buffer. That is, the multiplexer in the feedback circuit may not feedback the output signal of the first frequency divider or the second frequency divider to the mixer unit.

Here, in the mixer unit 320, the following equation can be expressed.

$F\text{in}/2 = F\text{out}$

That is, the mixer unit 320 operates as a buffer. The frequency signal output from the first frequency divider 330 may be a signal obtained by dividing the frequency signal output from the oscillator 310 at a division ratio of 1/2.

Figure 3D:
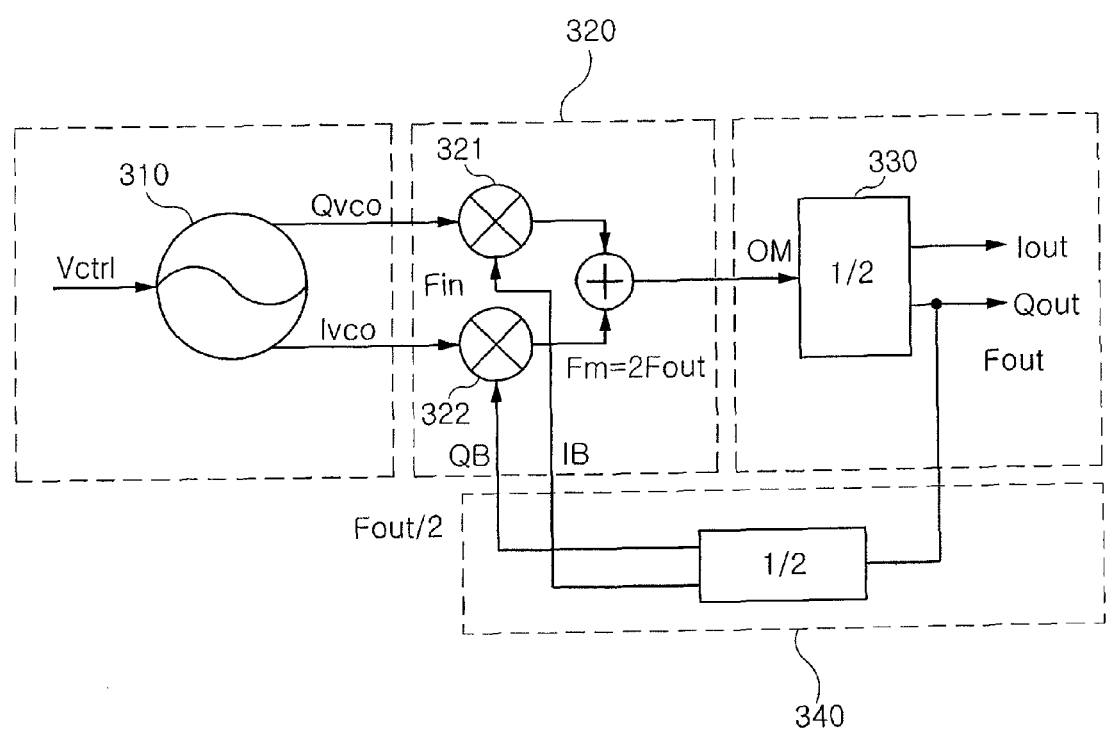

FIG. 3D is a view illustrating the operation of the feedback circuit 340 such that the frequency generator according to the embodiment, shown in FIG. 1, can output an output signal corresponding to the mode D of FIG. 2.

Referring to FIG. 3D, in the frequency generator according to this embodiment, the feedback circuit 340 may feedback to the mixer unit 320, a signal obtained by dividing the output signal of the first frequency divider 330 at the division ratio of 1/2. Here, in order that the mixer unit 320 can operate as an up converter, the multiplexer in the feedback circuit may transmit an I signal to the first mixer 321 in the mixer unit and a Q signal to the second mixer 322 in the mixer unit.

Here, in the mixer unit 320, the following equation can be expressed.

$F\text{in} + F\text{out}/2 = 2F\text{out}$

Therefore, the following equation can be obtained.

$F\text{out} = F\text{in}/1.5$

That is, the mixer unit 320 operates as an up converter. The frequency signal output from the first frequency divider 330 may be a signal obtained by dividing the frequency signal output from the oscillator 310 at a division ratio of 1/1.5.

As set forth above, according to the exemplary embodiments of the invention, a frequency generator can be reduced in size by use of one oscillator and has a wide tuning range and low phase noise by use of frequency dividers and a feedback circuit.

While the present invention has been shown and described in connection with the exemplary embodiments, it will be apparent to those skilled in the art that modifications and variations can be made without departing from the spirit and scope of the invention as defined by the appended claims.

What is claimed is:

1. A frequency generator comprising:
an oscillator configured to generate an oscillation frequency signal;
a mixer unit having an input terminal, a feedback terminal, and an output terminal and being configured to output a frequency signal through the output terminal, the frequency signal obtained by adding or subtracting frequency of a feedback signal, input through the feedback terminal, to or from frequency of the oscillation frequency signal input through the input terminal from the oscillator;
a first frequency divider configured to divide the frequency signal output from the mixer unit at a division ratio of N (N is a multiple of 2) to generate an output signal; and
a feedback circuit configured to adjust the output signal of the first frequency divider for the first frequency divider to output a frequency signal in a desired band and to feed back the adjusted signal to the feedback terminal of the mixer unit;
wherein the first frequency divider has a division ratio of 2, and the feedback circuit is configured so that the output signal of the first frequency divider is output as a frequency signal divided into first to fourth domains,
wherein the feedback circuit comprises:
a second frequency divider configured to divide the output signal of the first frequency divider at a division ratio of M (M is a multiple of 2) to generate an output signal; and
a multiplexer configured to receive the output signal of the first frequency divider and the output signal of the second frequency divider and to adjust the signals fed back into the mixer unit.

2. The frequency generator of claim 1, wherein the first domain is a frequency domain in which the oscillation frequency is divided at a division ratio of N+1.

3. The frequency generator of claim 1, wherein the second domain is a frequency domain in which the oscillation frequency is divided at a division ratio of N+1/M.

4. The frequency generator of claim 1, wherein the third domain is a frequency domain in which the oscillation frequency is divided at a division ratio of 1/N.

5. The frequency generator of claim 1, wherein the fourth domain is a frequency domain in which the oscillation frequency is divided at a division ratio of N−1/M.

6. The frequency generator of claim 1, wherein the second frequency divider has a division ratio of 2.

7. A frequency generator comprising:
an oscillator generating oscillation frequency;
a mixer unit having an input terminal, a feedback terminal, and an output terminal, and outputting a frequency signal through the output terminal, the frequency signal obtained by adding or subtracting feedback signal frequency, input through the feedback terminal, to or from the oscillation frequency input through the input terminal from the oscillator; and
a feedback circuit including a first frequency divider dividing the frequency signal output from the mixer unit at a division ratio of 2 to generate an output signal, a second frequency divider dividing the output signal of the first frequency divider at a division ratio of 2 to generate an output signal; and a multiplexer receiving the signal of the first frequency divider and the signal of the second frequency divider and adjusting the signal fed back into the mixer unit.

8. The frequency generator of claim 7, wherein the multiplexer adjusts the signals fed back into the mixer unit so that the output signal of the first frequency divider comprises one frequency domain selected from:
a first frequency domain obtained by dividing the oscillation frequency at a division ratio of 3;
a second frequency domain obtained by dividing the oscillation frequency at a division ratio of 2.5;
a third frequency domain obtained by dividing the oscillation frequency at a division ratio of 2; and
a fourth frequency domain obtained by dividing the oscillation frequency at a division ratio or 1.5.

9. A frequency generator comprising:
an oscillator configured to generate an oscillation frequency signal;
a mixer unit having an input terminal, a feedback terminal, and an output terminal and configured to output a frequency signal through the output terminal, the frequency signal obtained by adding or subtracting frequency of a feedback signal, input through the feedback terminal, to or from frequency of the oscillation frequency signal input through the input terminal from the oscillator;
a first frequency divider configured to divide the frequency signal output from the mixer unit at a division ratio of N (N is a multiple of 2) to generate an output signal; and
a feedback circuit adjusting the output signal of the first frequency divider for the first frequency divider to output a frequency signal in a desired band and to feed back the adjusted signal to the feedback terminal of the mixer unit;
wherein the feedback circuit is configured so that the output signal of the first frequency divider is output as a frequency signal divided into first to fourth domains,
wherein the feedback circuit comprises:
a second frequency divider configured to divide the output signal of the first frequency divider at a division ratio of M (M is a multiple of 2) to generate an output signal; and
a multiplexer configured to receive the output signal of the first frequency divider and the output signal of the second frequency divider and adjusting the signals fed back into the mixer unit.

10. The frequency generator of claim 9, wherein the first frequency divider has a division ratio of 2.

* * * * *